United States Patent [19]

Tango

[11] 4,288,829
[45] Sep. 8, 1981

[54] PROTECTIVE CIRCUIT ON INSULATING SUBSTRATE FOR PROTECTING MOS INTEGRATED CIRCUIT

[75] Inventor: Hiroyuki Tango, Yokohama, Japan

[73] Assignee: Agency of Industrial Science and Technology, Tokyo, Japan

[21] Appl. No.: 951,304

[22] Filed: Oct. 13, 1978

Related U.S. Application Data

[63] Continuation of Ser. No. 768,849, Feb. 15, 1977, abandoned.

[30] Foreign Application Priority Data

Feb. 18, 1976 [JP] Japan ................... 51-15816

[51] Int. Cl.³ .............................................. H02H 3/20
[52] U.S. Cl. ....................................... 361/56; 361/91;
357/50; 357/47
[58] Field of Search ................. 361/56, 91; 357/41,
357/51, 47, 50, 4; 307/304, DIG. 6

[56] References Cited

U.S. PATENT DOCUMENTS

| | | | |
|---|---|---|---|
| 3,403,270 | 9/1968 | Pace et al. ................ | 357/41 X |
| 3,636,418 | 1/1972 | Burns ......................... | 357/4 |
| 3,712,995 | 1/1973 | Steudel ..................... | 361/56 X |
| 3,728,591 | 4/1973 | Sunshine ................... | 357/4 |
| 3,967,295 | 6/1976 | Stewart ..................... | 361/56 X |
| 4,042,948 | 8/1977 | Kilby ........................ | 357/47 X |
| 4,092,735 | 5/1978 | McElroy .................... | 357/50 X |

Primary Examiner—Patrick R. Salce
Attorney, Agent, or Firm—Frishauf, Holtz, Goodman and Woodward

[57] ABSTRACT

A MOS integrated circuit comprises a MOS IC body including at least one MOS transistor made of an island-like semiconductor layer formed on an insulating substrate, and a protective circuit connected between a signal input terminal and the gate electrode of a MOS transistor at least at an input stage of the MOS IC body and adapted to protect the MOS integrated circuit against an irregular input signal. The protective circuit is also connected between ground and the gate electrode of the MOS transistor at the input stage of the MOS IC body and comprises a protective MOS transistor made of an island-like semiconductor layer formed on the insulating substrate in a manner to be arranged in juxtaposition with the MOS transistor at the input stage of the MOS IC body, a resistor connected between the signal input terminal and the gate circuit of the MOS transistor as the input stage of the MOS IC body the resistor being formed on a grounded insulating layer on the semiconductor layer overlying the insulating substrate to provide a stray capacitance therebetween, the resistor being formed in juxtapositon with the protective MOS transistor.

6 Claims, 5 Drawing Figures

F I G. 2
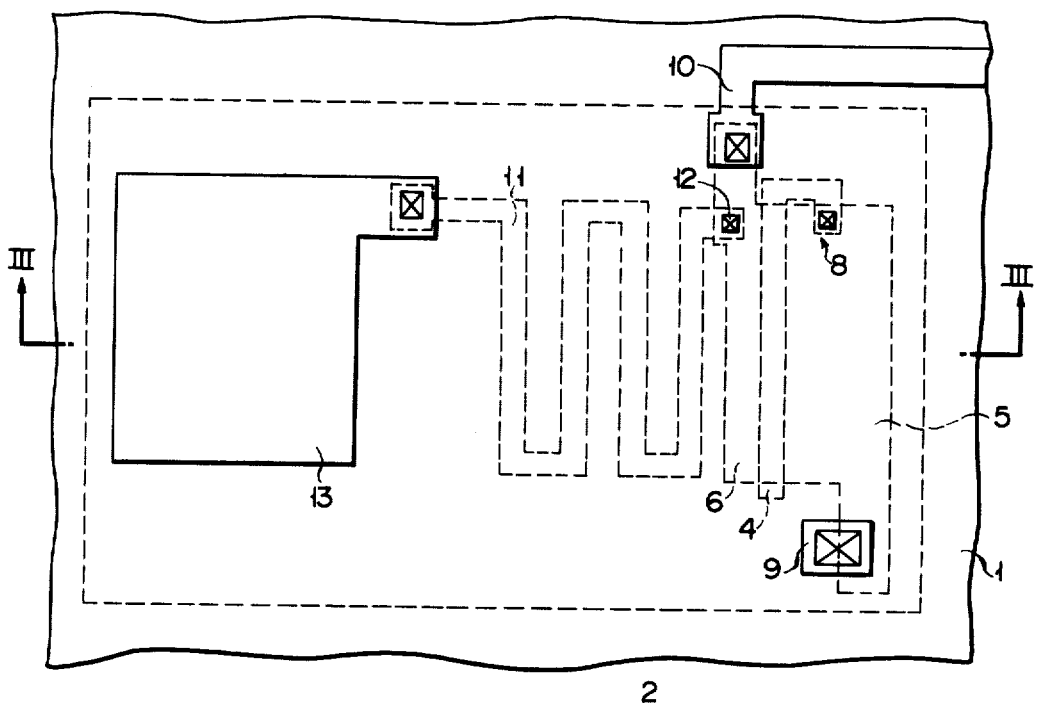
F I G. 3
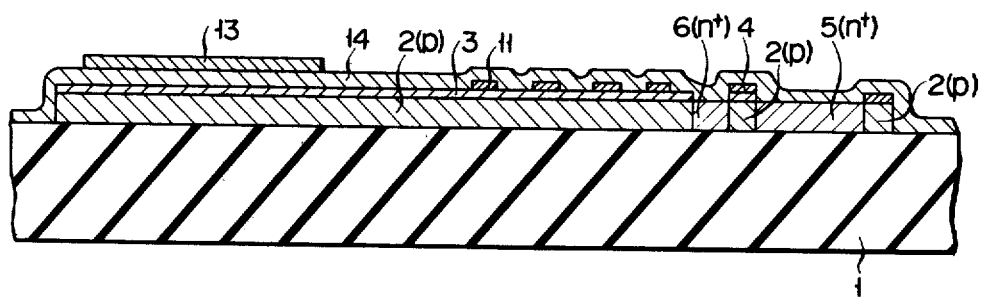

PROTECTIVE CIRCUIT ON INSULATING SUBSTRATE FOR PROTECTING MOS INTEGRATED CIRCUIT

This is a continuation of application Ser. No. 768,849, filed Feb. 15, 1977, now abandoned.

BACKGROUND OF THE INVENTION

This invention relates to a MOS integrated circuit including an improved protective circuit adapted to protect the MOS integrated circuit from an irregular input signal which is inputted to a MOS transistor at an input stage of a MOS IC body of the MOS integrated circuit.

With the advent of high-density, high speed MOS integrated circuits there is a tendency that, for example, a silicon oxide film which is used between a substrate and the gate electrode of a MOS transistor becomes thinner and thinner. There is, however, a fear that the gate electrode of a MOS transistor which is the input stage of the MOS integrated circuit will be destroyed by an external surge pulse signal. To avoid such a disadvantage a protective circuit is connected between the gate electrode of the MOS transistor and a signal input terminal. The protective circuit is incorporated in IC form into the MOS integrated circuit, the equivalent circuit of which is shown in FIG. 1. In the circuit shown in FIG. 1 a MOS transistor $Q_1$ for a driver and MOS transistor $Q_2$ for a load constitute an inverter at the input stage of the MOS integrated circuit and a protective MOS transistor $Q_3$ is connected between the gate electrode of the MOS transistor $Q_1$ and has a drain electrode connected to the gate of the MOS transistor $Q_1$ and a source electrode connected to ground. A resistor R is connected between the gate of the MOS transistor $Q_1$ and a signal input terminal Inp. The protective MOS transistor $Q_3$ constitutes, together with the resistor R, a protective circuit.

The breakdown of the gate is caused dependent upon the level of a peak value and sharp rise of an input surge pulse signal to the signal input terminal Inp. The protective MOS transistor $Q_3$ performs an effective protective function against the peak value of surge voltage since the drain withstand voltage is involved. A C-R circuit comprises the resistor R and a stray capacitance Cs present between a junction of the gate of the MOS transistor $Q_1$ and drain of the protective transistor $Q_3$ and ground and serves to make the sharp rise of the surge pulse gentle. In this case, the greater the CR value of the C-R circuit, the more pronounced the protection effect of the C-R circuit. Recent tendency is toward a MOS integrated circuit of SOS (silicon on sapphire) construction in which an island-like semiconductor layer is formed on an insulating substrate and includes elements such as transistors, diodes, resistors, capacitors, etc. Such an SOS structure permits fabrication of a high-speed MOS integrated circuit, since it can greatly reduce unnecessary pn junctions and stray capacitance of connections. Furthermore, a high-density MOS integrated circuit can be obtained, because elements can be readily and positively separated from each other. However, the great reduction of the stray capacitance causes the CR value of the CR circuit in the protective circuit to be reduced, causing a disadvantage from the standpoint of protection against a surge input pulse. A protective circuit in the MOS integrated circuit of SOS construction will be explained by referring to FIG. 1.

An electrostatic capacitance C between ground and the gate, source and drain regions of the MOS transistors $Q_1$, $Q_2$ and $Q_3$ made of island-like semiconductor layers formed on the insulating substrate is determined as follows. The capacitance between the gates of the MOS transistors and ground is determined by the thickness of the insulating substrate and thickness of an oxide film, such as an $SiO_2$ film, formed in the semiconductor structure, while the capacitance between the source and drain regions of the MOS transistors and ground is determined by the thickness of the insulating substrate. Since the resistor R is formed directly on the insulating substrate, its capacitance is determined only by a thickness of about 300 to 500$\mu$ from the insulating substrate and becomes an extremely small value, failing to sufficiently absorb the sharp rise of a surge pulse. As a result, the gate electrode of the MOS transistor $Q_1$ at the input stage is exposed to an increased risk of destruction.

SUMMARY OF THE INVENTION

It is accordingly the object of this invention to provide an improved MOS integrated circuit free from the above-mentioned drawbacks, and in particular a MOS integrated circuit of SOS construction which includes a protective circuit for preventing a gate electrode of a MOS transistor at the input stage from being destroyed by an irregular input pulse from a signal input terminal.

According to this invention there is provided a MOS integrated circuit comprising a MOS IC body including an insulating substrate and a MOS transistor made of an island-like semiconductor layer formed on the insulating substrate and constituting at least an input stage; and a protective circuit connected between a signal input terminal and the gate electrode of the MOS transistor at the input stage of the MOS IC body and comprising a protective MOS transistor made of an island-like semiconductor layer formed on the same insulating substrate and connected between the gate electrode of the MOS transistor at the input stage of the MOS IC body and ground, said protective MOS transistor being formed in juxtaposition with the MOS transistor at the input stage of the MOS IC body, and a resistor connected between the signal input terminal and the gate electrode of the MOS transistor at the input stage of the MOS IC body and formed in or on the island-like semiconductor layer in the protective circuit to provide a stray capacitance, said resistor being formed in juxtaposition with the protective MOS transistor. Further, a bonding pad is formed on the insulating layer on the semiconductor layer overlying the insulating substrate and connected to one end of the resistor so that the pad can be used as a signal input terminal. A stray capacitance is present between the bonding pad and the semiconductor layer. When an irregular signal, for example, a surge input pulse signal is supplied through the signal input terminal to the gate electrode of the input stage of the MOS IC body, the protective MOS transistor alleviates the influence exerted by the peak value of the surge input pulse over the gate electrode of the MOS transistor at the input stage of the MOS IC body. The influence of a sharp rise surge pulse is also alleviated due to the electrostatic capacitance between the resistor and the grounded semiconductor layer, and between the bonding pad and the grounded semiconductor layer, which serves as a stray capacitance in the C-R circuit. The value of the stray capacitance can be suitably selected according to the application. Such a simple arrangement permits the MOS IC body to be sufficiently protected against an influence from an irregular input signal.

BRIEF DESCRIPTION OF THE DRAWING

FIG. 2 is a plan view showing a protective circuit according to one embodiment of this invention;

FIG. 3 is a fragmentary, cross-sectional view, as taken along line III—III in FIG. 2, showing the protective circuit in FIG. 2;

DETAILED DESCRIPTION OF THE PREFERRED EMBODIMENTS

Figure 1:
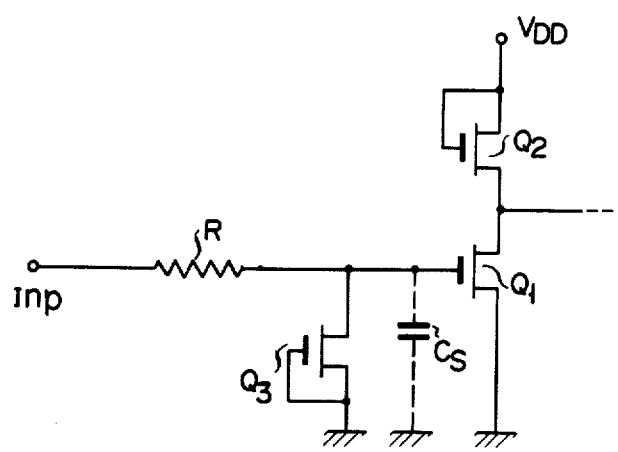
FIG. 1 shows an equivalent circuit of a protective circuit connected to a MOS transistor at the input stage of a MOS IC body.

One embodiment of this invention will be explained by referring to FIGS. 2 and 3.

An island consisting of a P-type silicon layer 2 is formed on a sapphire substrate 1 and a gate electrode 4 formed of a polycrystalline silicon is formed on the P-type silicon layer 2 through an oxide film made of SiO$_2$. An impurity is diffused in the P-type silicon layer 2 to provide an n$^+$ type source region 5 and n$^+$ type drain region 6 adjacent to the gate electrode 4. As a result, a protective MOS transistor 7 is formed. In the MOS transistor 7 the gate electrode 4 is short-circuited, by a short-circuit portion 8 in FIG. 2, to the source region 5. The source region 5 is connected by an aluminium film 9 to the P-type silicon layer 2 which is grounded. The drain region 6 is connected through an aluminium connection 10 to the gate electrode of a MOS transistor at the input stage of a MOS IC body (not shown) constituting part of the sapphire substrate. As shown in FIG. 2 a sinuous resistor 11 made of a polycrystalline silicon layer is formed by etching on the P-type silicon layer 2. One end of the resistor 11 is connected at a junction 12 in FIG. 2 to the drain region 6, while the other end of the resistor 11 is connected to a bonding pad 13 made of an aluminium film. When the aluminum film 9 and aluminum connection 10 are formed, the bonding pad 13 forming an uppermost layer is simultaneously formed by subjection to a series of processes such as evaporation, patterning etc. As will be evident from FIG. 3 the resistor 11 is formed on the P-type silicon layer 2 of the protective MOS transistor 7 and the oxide film 3 is formed between the P-type silicon layer 2 and the resistor 11. For example, the oxide film 3 has a thickness of 500 to 10,000 Å and the resistor 11 has a thickness of 3000 to 6000 Å. The resistor 11 is formed by a doping method so as to obtain a desired specific resistance and at this time consideration is also paid to the dimension of the resistor 11. The formation of the resistor 11 is effected simultaneously with, or independently of, the formation of the gate electrode 4. The resistance value of the resistor 11 may be so properly selected that the time constant of the C-R circuit is 0.1 to 5 ns for a high-speed LSI configuration. After the formation of the transistor 7 an resistor 11 and oxide film 14 is formed by, for example, a CVD (Chemical Vapor Deposition) method on the oxide film 3, transistor 7 and resistor 11. The bonding pad 13 is formed on the oxide film 14 and near the resistor 11 and constitutes a signal input terminal. Although the protective circuit is of an SOS configuration, its P-type silicon layer 2 is situtated below the resistor 11 and bonding pad 13 and also constitutes part of the MOS transistor 7. That is, the protective circuit section has a MOS IC construction using an ordinary semiconductor substrate. In consequence, the oxide film 3 is situated between the P-type silicon layer 2 and the resistor 11, and the oxide films 3 and 14 are situtated between the P-type silicon layer 2 and the bonding pad 13. Since the P-type silicon layer 2 is grounded, it is possible to provide a great stray capacitance between the bonding pad 13 and ground.

Figure 6:
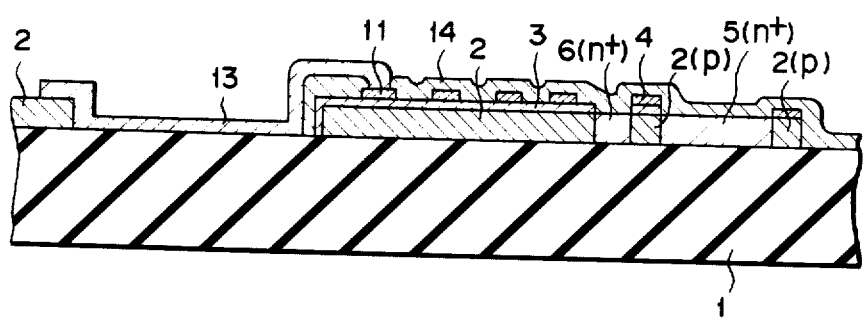
FIGS. 6 and 7 illustrate modifications of the embodiments of FIGS. 3 and 5, respectively.
Figure 7:
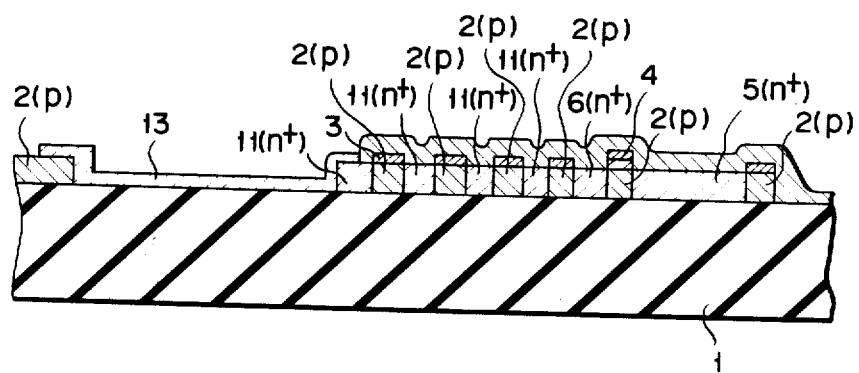

The CR value of the C-R circuit in the protective circuit is necessary for absorption of a sharp rise surge current. If, however, too great a stray capacitance is involved, not only an unrequired surge pulse waveform but also a desired signal waveform is greatly varied, and there is a fear that the high-speed operation characteristic is degraded for an ultra high speed MOS IC configuration. To prevent such a disadvantage, adjustment can be made, by forming the bonding pad 13 directly on the sapphire substrate 1 without disposing the P-type silicon layer 2 and oxide films 3 and 14 between the bonding pad 13 and the substrate 1, as shown in FIGS. 6 and 7, so that the stray capacitance in the protective circuit can be decreased. Although in the above-mentioned embodiment the adjustment of the time constant in the C-R circuit is made with respect to the stray capacitance, the same result can also be obtained by varying the length and width of the resistor 11 or the thickness of the oxide film. In this case, the equivalent circuit is the same as that in FIGS. 2 and 3.

Figure 4:
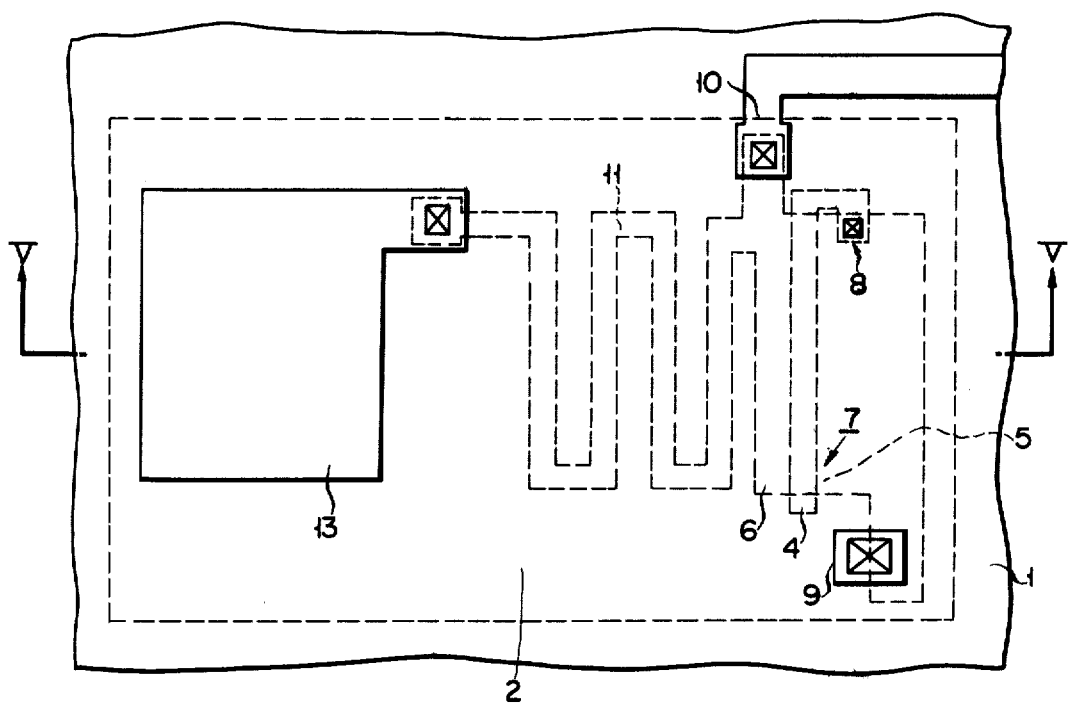
FIG. 4 is a plan view showing a protective circuit according to another embodiment of this invention.
Figure 5:
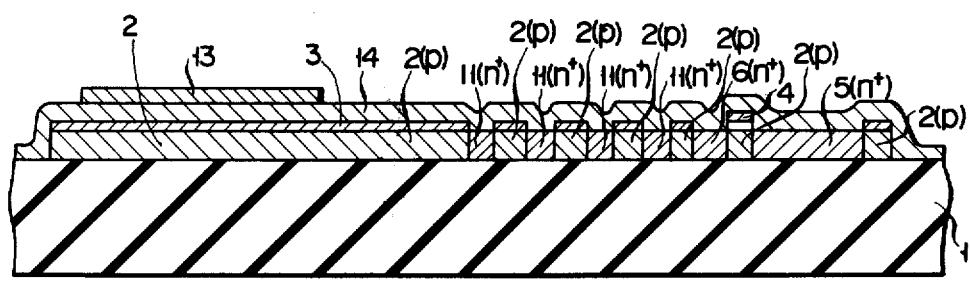
FIG. 5 is a fragmentary, cross-sectional view, as taken along V—V in FIG. 4, showing the protective circuit in FIG. 4.

Another embodiment of this invention will now be explained by referring to FIGS. 4 and 5.

In this embodiment, the same reference numerals are employed to designate parts or sections corresponding to those shown in FIGS. 2 and 3 and further explanation is omitted. In the embodiment shown in FIGS. 4 and 5 the formation of a resistor 11 is effected simultaneously with, or independently of,.the formation of source and drain regions 5 and 6 of a protective MOS transistor 7. If any portion of the P-type layer 2 other than that the portion on which the resistor 11 is located is formed with the channel region of a MOS transistor 7 and with a gate electrode 4, and an impurity is diffused in the P-type layer 2, a resistor 11 made of an n$^+$ diffusion layer can be easily formed. If the resistor 11 is formed independently, an ion implantation method, for example, is employed. In consequence, the resistor 11 is connected at one end to the drain region 6 of the protective MOS transistor 7 and at the other end to a bonding pad 13. In this structure, a capacitance resulting from a pn junction is present between the resistor 11 and the P-type silicon layer 2. The capacitance serves as the stray capacitance as explained in connection with the first embodiment and can constitute the CR components of a CR circuit in the protective circuit.

This invention is not restricted only to the above-mentioned embodiments and can be varied in a variety of ways without departing from the spirit and scope of this invention.

What is claimed is:

1. In a protective circuit for a MOS integrated circuit comprising a MOS IC body including at least one MOS transistor at an input stage of a MOS integrated circuit, the at least one input stage transistor being made of an island-like semiconductor layer formed on an insulating substrate and having source, drain and gate electrodes; and the improvement wherein the protective circuit is formed on the insulating substrate of the MOS IC body for protecting the MOS integrated circuit, the protective circuit comprising:

an R-C protective circuit connected between a signal input terminal and a gate electrode of the at least one MOS input stage transistor and comprising a protective MOS transistor made of a first region of an island-like semiconductor layer of one conductivity type on an insulating substrate and having source, drain and gate electrodes, said protective MOS transistor being connected between ground and the gate electrode of the at least one MOS input stage transistor, the source electrode of said protective MOS transistor being connected to ground and the drain electrode of said protective MOS transistor being connected to the gate electrode of the at least one MOS input stage transistor;

a sinuous resistor being formed on an insulating layer on a second region of the island-like semiconductor layer which is connected to ground, overlying the insulating substrate so as to provide a stray capacitance and connected between the signal input terminl and the gate electrode of the protective MOS transistor, said resistor having a conductivity type opposite to said one conductivity type of the island-like semiconductor layer; and a bonding pad formed on the insulating layer on the second region of the semiconductor layer overlying the insulating substrate, said bonding pad being connected to one end of the resistor so as to provide a stray capacitance between said semiconductor layer and said bonding pad, said stray capacitances forming the capacitive component of said R-C protective circuit.

2. A MOS integrated circuit according to claim 1, in which said insulating substrate is a sapphire substrate.

3. A MOS integrated circuit according to claim 1, in which said resistor comprises a polycrystalline silicon.

4. A MOS integrated circuit according to claim 5, in which said bonding pad is disposed on the outer surface of the semiconductor layer near the end of the semiconductor layer, and said resistor is connected at one end of the drain region of the protective MOS transistor and at the other end to said bonding pad.

5. A MOS integrated circuit according to claim 1, in which said resistor has one end thereof formed integral with the drain region of the protective MOS transistor and the other end thereof connected to said signal input terminal, said resistor being formed by diffusing an impurity into the island-like semiconductor layer so that a pn junction capacitance is present in the island-like semiconductor layer.

6. In a protective circuit for a MOS integrated circuit comprising a MOS IC body including at least one MOS transistor at an input stage of a MOS integrated circuit, the at least one input stage transistor being made of an island-like semiconductor layer formed on an insulating substrate and having source, drain and gate electrodes; and the improvement wherein the protective circuit is formed on the insulating substrate of the MOS IC body for protecting the MOS integrated circuit, the protective circuit comprising:

an R-C protective circuit connected between a signal input terminal and a gate electrode of the at least one MOS input stage transistor and comprising a protective MOS transistor made of a first region of an island-like semiconductor layer of one conductivity type on an insulating substrate and having source, drain and gate electrodes, said protective MOS transistor being connected between ground and the gate electrode of the at least one MOS input stage transistor, the source electrode of said protective MOS transistor being connected to ground and the drain electrode of said protective MOS transistor being connected to the gate electrode of the at least one MOS input stage transistor;

a sinuous resistor being formed on an insulating layer on a second region of the island-like semi-conductor layer which is connected to ground, overlying the insulating substrate so as to provide a stray capacitance and connected between the signal input terminal and the gate electrode of the protective MOS transistor, said resistor having a conductivity type opposite to said one conductivity type of the island-like semiconductor layer; and a bonding pad disposed directly on the insulating substrate, said bonding pad being connected to one end of the resistor so as to provide a stray capacitance between said semiconductor layer and said bonding pad, said stray capacitance forming the capacitive component of said C-R protective circuit.

* * * * *